United States Patent
Watanabe et al.

(10) Patent No.: US 7,115,908 B2
(45) Date of Patent: Oct. 3, 2006

(54) III-NITRIDE LIGHT EMITTING DEVICE WITH REDUCED POLARIZATION FIELDS

(75) Inventors: Satoshi Watanabe, Cupertino, CA (US); Stephen A. Stockman, Morgan Hill, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 401 days.

(21) Appl. No.: 10/769,260

(22) Filed: Jan. 30, 2004

(65) Prior Publication Data

US 2005/0169333 A1 Aug. 4, 2005

(51) Int. Cl.
- *H01L 27/15* (2006.01)
- *H01L 31/12* (2006.01)
- *H01L 33/00* (2006.01)

(52) U.S. Cl. .............. 257/79; 257/85; 257/86; 257/103

(58) Field of Classification Search .......... 257/13, 257/79–103
See application file for complete search history.

(56) References Cited

U.S. PATENT DOCUMENTS

| | | |
|---|---|---|
| 6,515,313 B1 | 2/2003 | Ibbetson et al. |
| 2002/0058349 A1 | 5/2002 | Khan et al. |

FOREIGN PATENT DOCUMENTS

JP  2005-217415  * 8/2005

OTHER PUBLICATIONS

Jianping Zhang et al., "Enhanced luminescence in InGaN multiple quantum wells with quaternary AlInGaN barriers", Applied Physics Letters, vol. 77, No. 17, Oct. 23, 2000, pp. 2668-2670.

M. E. Aumer et al., "Strain-induced piezoelectric field effects on light emission energy and intensity from AlInGaN/InGaN quantum wells", Applied Physics Letters, vol. 79, No. 23, Dec. 3, 2001, pp. 3803-3805.

J. Zhang et al., "Pulsed atomic layer epitaxy of quaternary AlInGaN layers", Applied Physics Letters, vol. 70, No. 7, Aug. 13, 2001, pp. 925-927.

Changqing Chen et al., Pulsed Metalorganic Chemical Vapor Deposition of Quaternary AlInGaN Layers and Multiple Quantum Wells for Ultraviolet Light Emission, Jpn. J. Appl. Phys., vol. 41, (2002), Part 1, No. 4A, Apr. 2002, pp. 1924-1928.

* cited by examiner

*Primary Examiner*—Thien F. Tran
(74) *Attorney, Agent, or Firm*—Patent Law Group LLP; Rachel V. Leiterman

(57) ABSTRACT

A semiconductor light emitting device includes a light emitting layer sandwiched between two spacer layers. The difference between the net polarization in at least one of the spacer layers and the net polarization in the light emitting layer is less than in the device with conventional spacer layers, such as GaN spacer layers. The difference between the net polarization in at least one of the spacer layers and the net polarization in the light emitting layer is less than about 0.02 $C/m^2$. In some embodiments, at least one of the spacer layers is a quaternary alloy of aluminum, indium, gallium, and nitrogen.

41 Claims, 7 Drawing Sheets

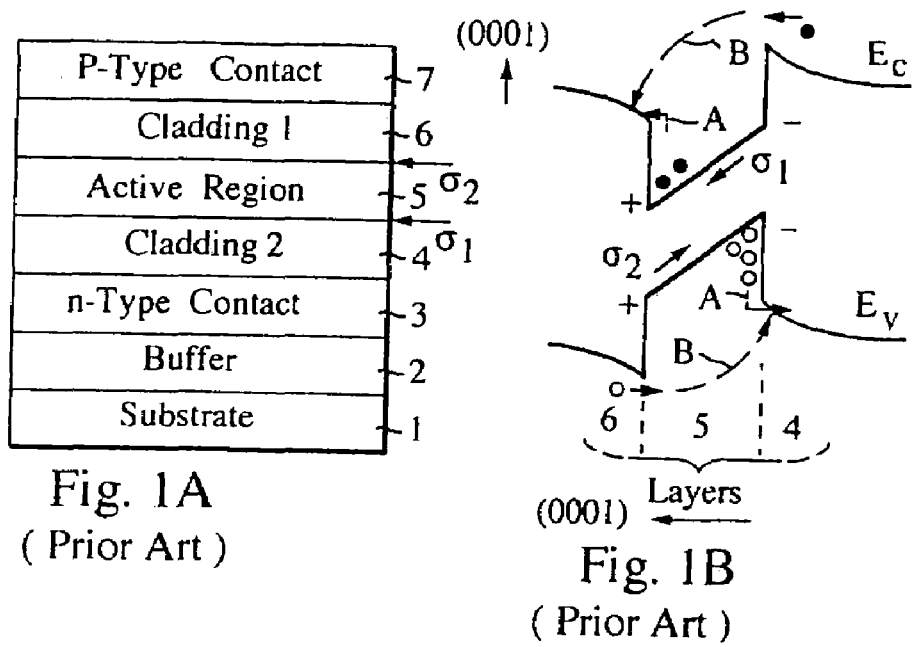
| | |
|---|---|
| P-Type Contact — 7 | |
| Cladding 1 — 6 | |
| Active Region — 5 $\sigma_2$ | |
| Cladding 2 — 4 $\sigma_1$ | |
| n-Type Contact — 3 | |
| Buffer — 2 | |
| Substrate — 1 | |
Fig. 1A
(Prior Art)
Fig. 1B
(Prior Art)
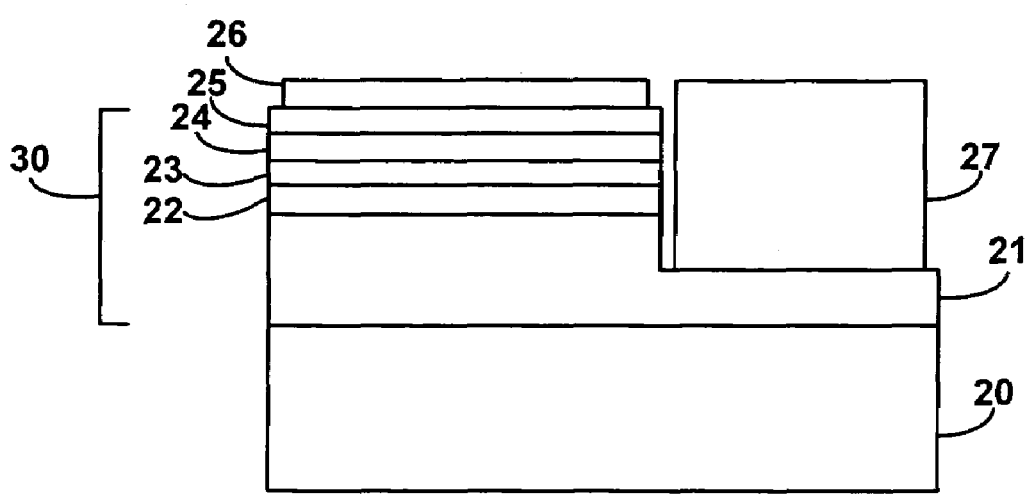
Fig. 2

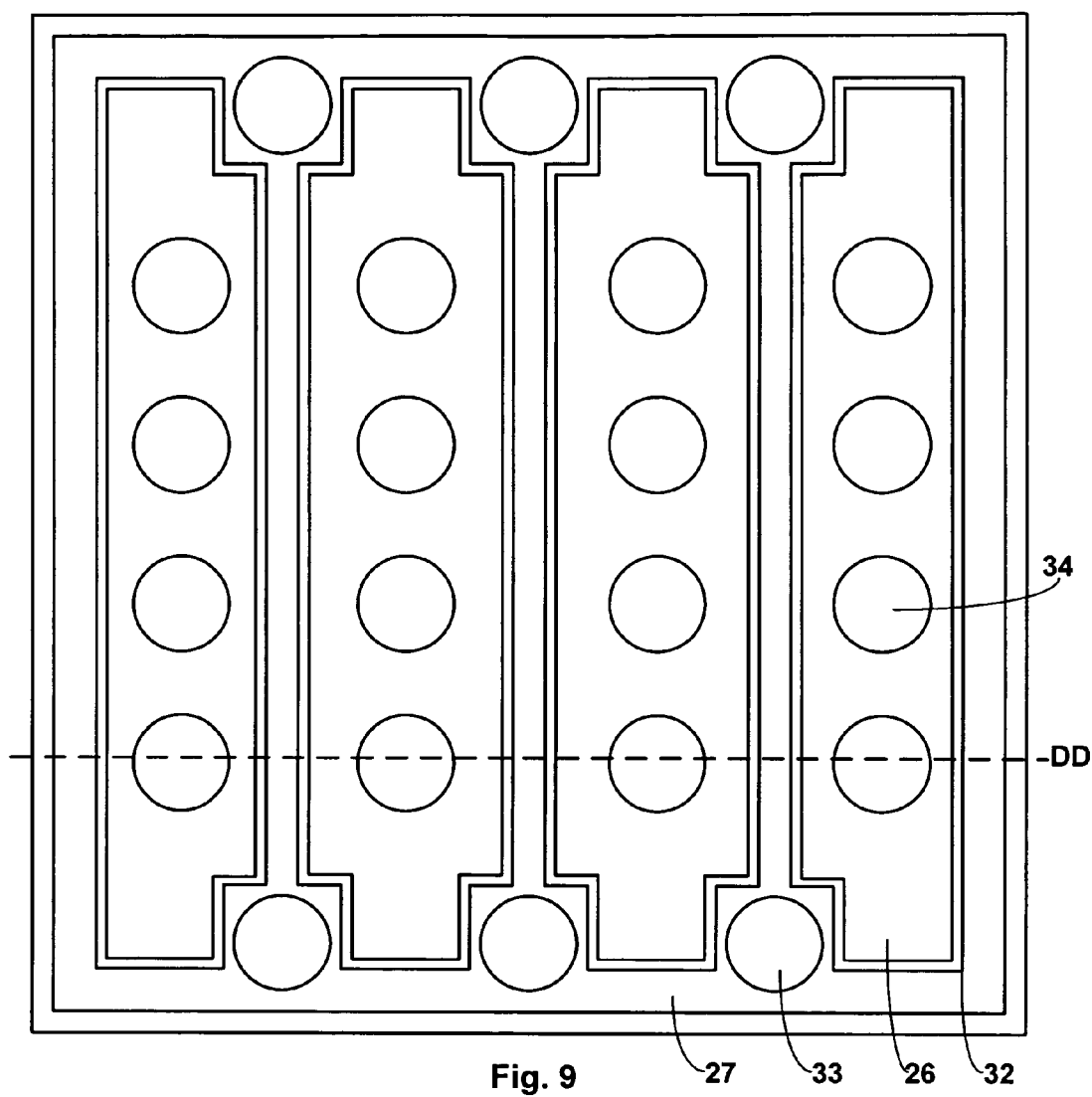
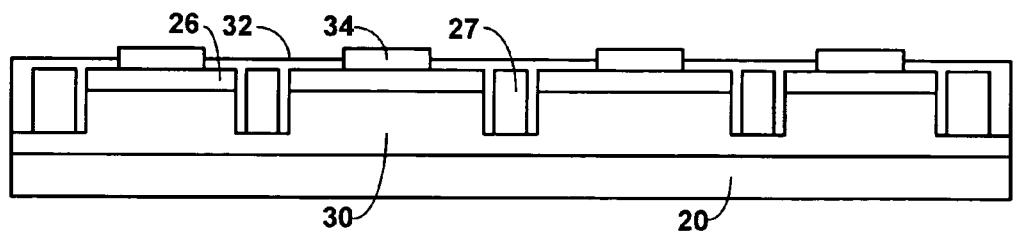
Fig. 9
Fig. 10

III-NITRIDE LIGHT EMITTING DEVICE WITH REDUCED POLARIZATION FIELDS

BACKGROUND

1. Field of Invention

The present invention relates to III-nitride light emitting devices.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, a light emitting or active region formed over the n-type layer or layers, and one or more p-type layers doped with, for example, Mg, formed over the active region. III-nitride devices formed on conductive substrates may have the p- and n-contacts formed on opposite sides of the device. Often, III-nitride devices are fabricated on insulating substrates, such as sapphire, with both contacts on the same side of the device. Such devices are mounted so light is extracted either through the contacts (known as an epitaxy-up device) or through a surface of the device opposite the contacts (known as a flip chip device).

The crystal layers in III-nitride devices are often grown as strained wurtzite crystals on lattice-mismatched substrates such as sapphire. Such crystals exhibit two types of polarization, spontaneous polarization, which arises from the difference of alloy composition between layers of different composition, and piezoelectric polarization, which arises due to the strain in the layers of the device. The total polarization in a layer is the sum of the spontaneous and piezoelectric polarization.

FIG. 1A is a sectional view schematically illustrating a typical conventional strained wurtzite nitride double heterostructure semiconductor, described in U.S. Pat. No. 6,515,313. According to U.S. Pat. No. 6,515,313, the illustrated substrate layer 1 may be any material suitable for growing nitride semiconductors, including spinel ($MgAl_2O_4$), sapphire ($Al_2O_3$), SiC (including 6H, 4H, and 3C), ZnS, ZnO, GaAs, AlN and GaN. The substrate thickness typically ranges from 100 μm to 1 mm. A buffer layer 2 on the substrate 1 can be formed of AlN, GaN, AlGaN, InGaN or the like. The buffer layer facilitates possible lattice mismatches between the substrate 1 and an overlying conductive contact layer 3. However, the buffer layer 2 may be omitted if the substrate has a lattice constant approximately equal to that of the nitride semiconductor. The buffer layer 2 may also be omitted with some nitride growth techniques. Depending upon the material composition, the buffer layer energy bandgap may range from 2.1 eV to 6.2 eV, with a thickness of about 0.5 μm to 10 μm.

The n-type contact layer 3 is also typically formed from a nitride semiconductor, preferably GaN or InGaN with a thickness ranging from 0.5 μm to 5.0 μm, and a bandgap of approximately 3.4 eV for GaN and less for InGaN (depending upon the Indium concentration). A lower n-type or undoped cladding layer 4 on the conductive layer 3 conventionally comprises GaN or AlGaN, with a bandgap of 3.4 eV for GaN and greater for AlGaN (depending upon the Al concentration). Its thickness can range from 1 nm to 100 nm.

Nitride double heterostructures typically employ InGaN as an active region 5 over the lower cladding layer, with a thickness of 1 nm to 100 nm. The bandgap of this layer is typically 2.8 eV for blue emission, but may vary depending upon the Indium concentration. A top p-type or undoped cladding layer 6 over the active region is generally comprised of AlGaN or GaN, with a thickness and bandgap energy similar to that of the lower n-type cladding layer 4. A p-type GaN conductive contact layer 7 on the cladding layer 6 has an energy bandgap of about 3.4 eV and a thickness of about 10 nm to 500 nm. A polarization-induced sheet charge occurs at the interface between layers due to different constituent materials. Of particular concern for the operation of a light emitter are the polarization-induced sheet charges adjacent to the active region 5.

With the compound semiconductor illustrated in FIG. 1A, a negative polarization-induced sheet charge density σ1, with a magnitude such as $10^{13}$ electrons/cm$^2$, is typically formed at the interface between the active region 5 and the lower cladding layer 4. A positive sheet charge density σ2 of similar magnitude is formed at the interface between the active region 5 and the upper cladding layer 6. The polarities of these charges depend upon the bonds of the crystal layers. In general, the density of a sheet charge will depend upon both a spontaneous factor arising from compositional differences between the two layers, and a piezoelectric strain arising from the lattice mismatch between the layers. For example, σ1 between an $In_{0.2}Ga_{0.8}N$ active region 5 and a GaN cladding layer 4 is about $8.3 \times 10^{12}$ electrons/cm$^2$. This is due to the 20% Indium content in the $In_{0.2}Ga_{0.8}N$ active region (spontaneous polarization), and the strain in that layer arising from the lattice mismatch with the underlying GaN layer (piezoelectric polarization).

FIG. 1B illustrates the energy bands corresponding to the device structure of FIG. 1A. When the device is operating, the naturally occurring polarization field generated by σ1 and σ2 reduces the efficiency in a number of ways. First, the dipole leads to a spatial separation (movement in the opposite direction) of electrons and holes within the region. As illustrated, holes in the valence band $E_v$ are attracted to the negative sheet charge σ1 at one end of the active region 5, while electrons in the conduction band $E_c$ are attracted to the positive sheet charge or σ2 at its other end. This spatial separation of free carriers lowers the probability of radiative recombination, reducing emission efficiency. Second, the energy barriers of the conduction and valence band quantum wells are reduced by quantization effects associated with the electric field. Thus, carriers below $E_v$ and above $E_c$ escape the well through the paths indicated by dashed lines A. Third, the presence of polarization-induced fields also leads to carrier overshoots, illustrated by carrier trajectories B, from the higher $E_c$ level on the σ1 side of the active region to the lower $E_c$ level on the σ2 side, and from the lower $E_v$ level on the σ2 side of the active region to the higher $E_v$ level on the σ1 side.

SUMMARY

In accordance with embodiments of the invention, a semiconductor light emitting device includes a light emitting layer sandwiched between two spacer layers. The difference between the net polarization in at least one of the spacer layers and the net polarization in the light emitting layer is less than in the device with conventional spacer layers, such as GaN spacer layers. The difference between the net polarization in at least one of the spacer layers and the net polarization in the light emitting layer is less than about 0.02 $C/m^2$. In some embodiments, at least one of the spacer layers is a quaternary alloy of aluminum, indium, gallium, and nitrogen.

Matching the net polarization in the spacer layers and the light emitting layers may move polarization-induced sheet charges away from the interfaces between the spacer layers and the light emitting layer to the interface between the p- and n-type regions and the spacer layers. Once the sheet-charges are spaced apart from the light emitting layer, in some embodiments the interface between the p- and n-type regions and the spacer layers is doped, which may reduce the polarization field across the light emitting layer. Accordingly, matching the net polarization in the spacer layers and the light emitting layers, and canceling sheet charges by doping may avoid the inefficiencies caused by polarization, described above.

BRIEF DESCRIPTION OF THE DRAWINGS

FIGS. 1A and 1B are a cross sectional view and an energy band diagram of a portion of a prior art light emitting device described in U.S. Pat. No. 6,515,313.

FIG. 2 is a cross sectional view of a device according to embodiments of the invention.

FIGS. 9 and 10 are a plan view and a cross sectional view of a large junction light emitting device.

DETAILED DESCRIPTION

Figure 3:
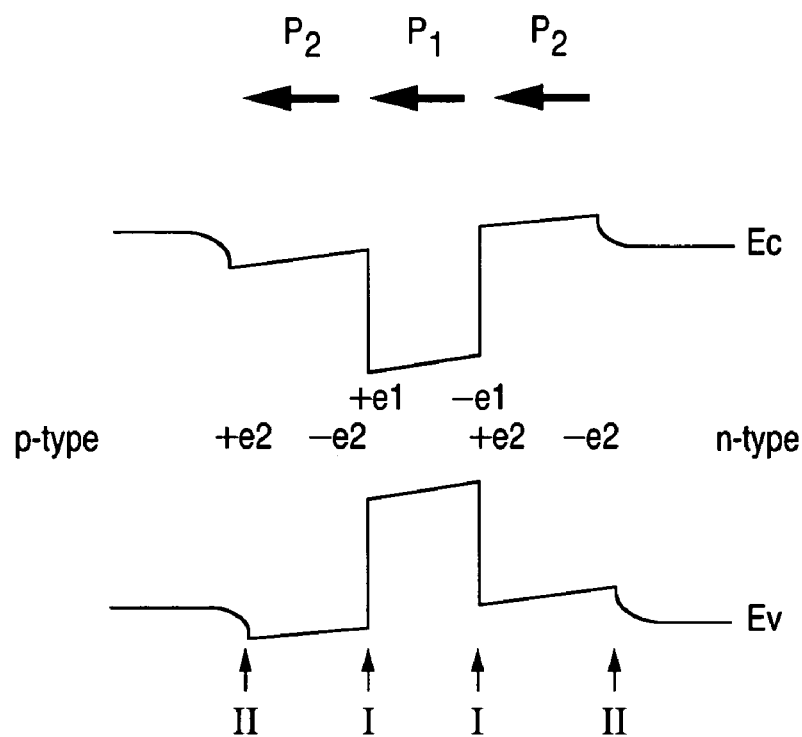
FIG. 3 is an energy band diagram of a device where the spacer layers and active region have the same net polarization.

FIG. 2 illustrates a device according to several embodiments of the invention. An n-type region 21 is formed over a suitable substrate 20, usually sapphire, SiC, or GaN. Active region 23 is sandwiched between two spacer layers, an n-type spacer layer 22 and a p-type spacer layer 24. Active region 23 may be a single light emitting layer or may include one or more quantum well layers separated by barrier layers. A p-type region 25 is formed over p-type spacer layer 24. P-contact 26 provides electrical contact to the p-side of the active region and n-contact 27 provides electrical contact to the n-side of the active region. Two possible arrangements of the p- and n-contacts are described below in FIGS. 7–10.

In some embodiments of the invention, one or more of p-type spacer layer 24, n-type spacer layer 22, and the barrier layers separating the quantum wells in a multiple quantum well active region may be quaternary alloys of aluminum, indium, gallium, and nitrogen. The composition of aluminum, indium, and gallium in the barrier layers and/or in spacer layers 22 and 24 are selected to match the net polarization within the light emitting layers of active region 23, or to minimize the difference in net polarization between the light emitting layers of the active region and the spacer layers and/or barrier layers. The net polarization in each layer is the sum of the spontaneous polarization and the piezoelectric polarization. The quaternary compositions required in the barrier layers and/or in spacer layers is based on the composition of the active region, which, along with the structure of the active region, determines the color of light emitted by the active region. Quaternary layers may be grown by techniques known in the art such as atmospheric pressure growth or pulsed metalorganic chemical vapor deposition (also known as pulsed atomic layer epitaxy). For a description of pulsed metalorganic chemical vapor deposition, see, for example, J. Zhang et al., "Pulsed Atomic Layer Epitaxy of Quaternary AlInGaN Layers," 79 Appl. Phys. Lett. 925 (2001) and C. Chen et al., "Pulsed Metalorganic Chemical Vapor Deposition of Quaternary AlInGaN Layers and Multiple Quantum Wells for Ultraviolet Light Emission," 41 Jpn. J. Appl. Phys. 1924 (2002), both of which are incorporated herein by reference.

The embodiments described below describe the characteristics of quaternary spacer layers. The same characteristics may be applied to form suitable quaternary barrier layers within a multiple quantum well active region.

In a first embodiment, the composition of the spacer layers are selected such that the difference in net polarization between the light emitting layers of the active region and at least one of the spacer layers is zero. The use of spacer layers with the same net polarization as the light emitting layers of the active region effectively cancels the sheet charges (shown in FIG. 1B) at the interface between the spacer layer and the active region. FIG. 3 illustrates a part of an energy band diagram for a device having a lightly doped or not intentionally doped active region and spacer layers, with quaternary spacer layers having the same net polarization as the active region ($P_1 = P_2$). FIG. 3 illustrates the canceling of sheet charges ($e_1 = e_2$) at the interfaces between the active region and the spacer layers on either side. FIG. 3 also illustrates that the sheet charges and resulting curves in the energy band diagram are not eliminated entirely, but are shifted from the interfaces between the active region and the spacer layers to the interfaces between the spacer layers and the p- and n-type regions.

In a second embodiment, the composition of the spacer layers is selected such that the barrier height is enough to provide a sufficient barrier, but the difference in net polarization between the light emitting layers of the active region and the spacer layers is less than in a device with conventional spacer layers, such as GaN spacer layers. The barrier height is defined as the difference between the band gap in the spacer layer and the band gap in the light emitting layers of the active region. Generally, the higher the composition of aluminum and indium in a quaternary III-nitride layer, the more difficult it is to grow a layer of high crystal quality. As illustrated below, in most devices, spacer layers according to the first embodiment have high compositions of aluminum and indium. Though devices according to the second embodiment do not completely cancel the sheet charges at the interface between the spacer layer and the active region, these devices have potentially smaller sheet charges than devices with conventional barriers, and potentially better crystal quality spacer layers than devices according to the first embodiment. Both effects may increase the efficiency of devices according to the second embodiment.

Figure 4:
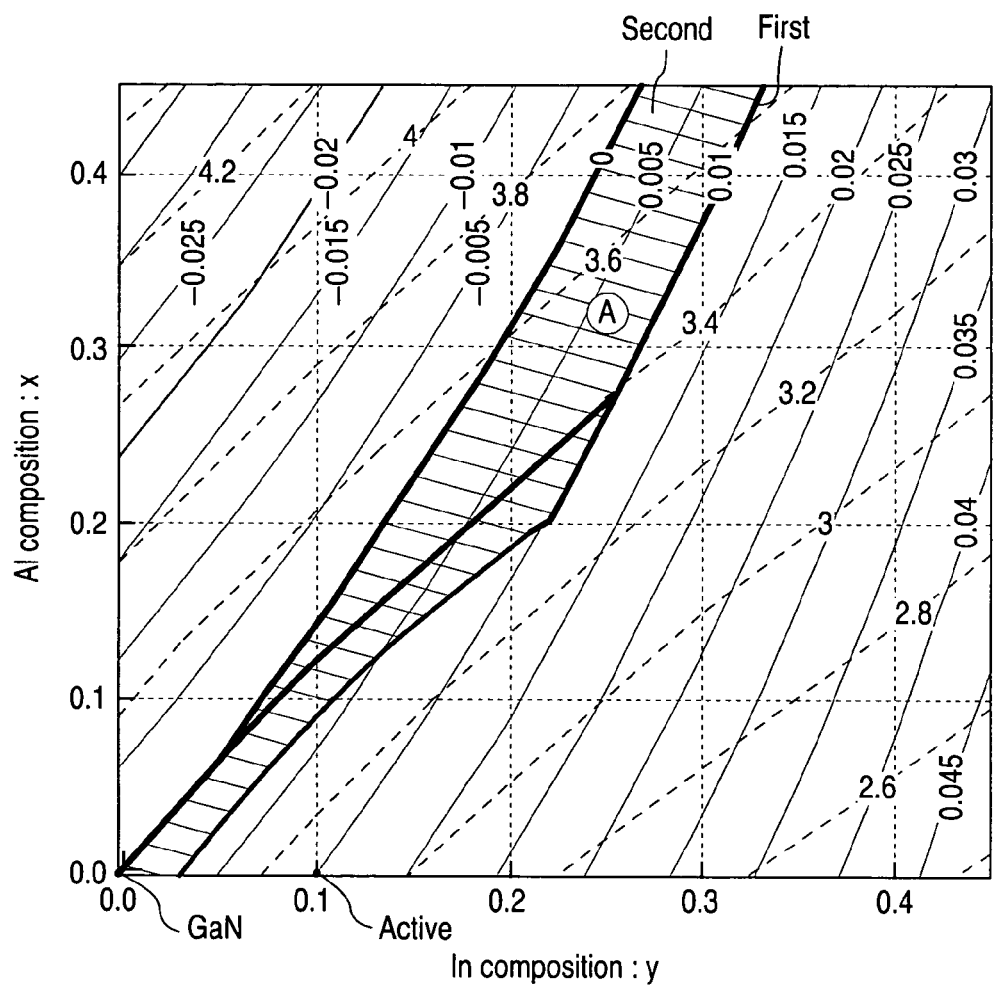
FIGS. 4 and 5 are plots of aluminum composition vs. indium composition for quaternary III-nitride layers, including contour lines showing band gap energy and net polarization.

FIG. 4 illustrates how to determine the appropriate composition of the spacer layers for the first and second embodiments, given an active region composition. FIG. 4 is a contour plot of the polarization and the bandgap of an $Al_xIn_yGa_zN$ film vs. aluminum nitride composition and indium nitride composition. The $Al_xIn_yGa_zN$ film is assumed to be coherently grown on GaN. The solid contour lines represent the net polarization in $C/m^2$. The dashed contour lines represent the band gap in eV. FIG. 4 illustrates an example of an InGaN active layer of 10% indium, $In_{0.1}Ga_{0.9}N$ (labeled "Active"), which may emit blue light when forward biased. $In_{0.1}Ga_{0.9}N$ has a band gap of about 3.1 eV and a net polarization of about 0.01 $C/m^2$. In the example given in FIG. 4, the minimum barrier height is arbitrarily selected to be 0.2 eV. In other embodiments, the minimum barrier height may be larger or smaller, for example 0.3 eV or 0.1 eV.

A composition range for spacer layers according to the first embodiment, where the spacer layers have the same net polarization as the active region, can be determined by following the 0.01 $C/m^2$ contour line in the direction of increasing indium composition and increasing aluminum composition until a composition with a band gap of at least 3.3 is reached, about $Al_{0.20}In_{0.22}Ga_{0.58}N$. Any spacer layer composition at this point or above along the 0.01 $C/m^2$ contour line (the solid line marked "First" on FIG. 4) will provide a barrier height of at least 0.2 eV with the same net polarization as the active region.

A composition range for spacer layers according to the second embodiment, where the spacer layers have a minimum barrier height and a net polarization less than that of a conventional spacer layer, is illustrated as shaded region "A" in FIG. 4. This region is bordered on the bottom right hand side by a curved line between about $In_{0.03}Ga_{0.97}N$ and about $Al_{0.20}In_{0.22}Ga_{0.58}N$, following a contour line representing the minimum barrier height of 0.2 eV. Region A is bordered on the top right hand side by a curved line between about $Al_{0.20}In_{0.22}Ga_{0.58}N$ and about $Al_{0.45}In_{0.34}Ga_{0.21}N$, representing the first embodiment composition range. Region A is bordered on the left hand side by a curved line between about GaN and about $Al_{0.45}In_{0.26}Ga_{0.29}N$, following a contour line representing the net polarization of a GaN spacer layer (labeled "GaN" on FIG. 4). Any spacer layer composition within this shaded region will have at least a 0.2 eV barrier and a net polarization less than that of a GaN spacer layer. The solid line within region A represents spacer layer compositions that have the same barrier height as a GaN spacer layer, but a net polarization less than that of a GaN spacer layer.

Figure 5:
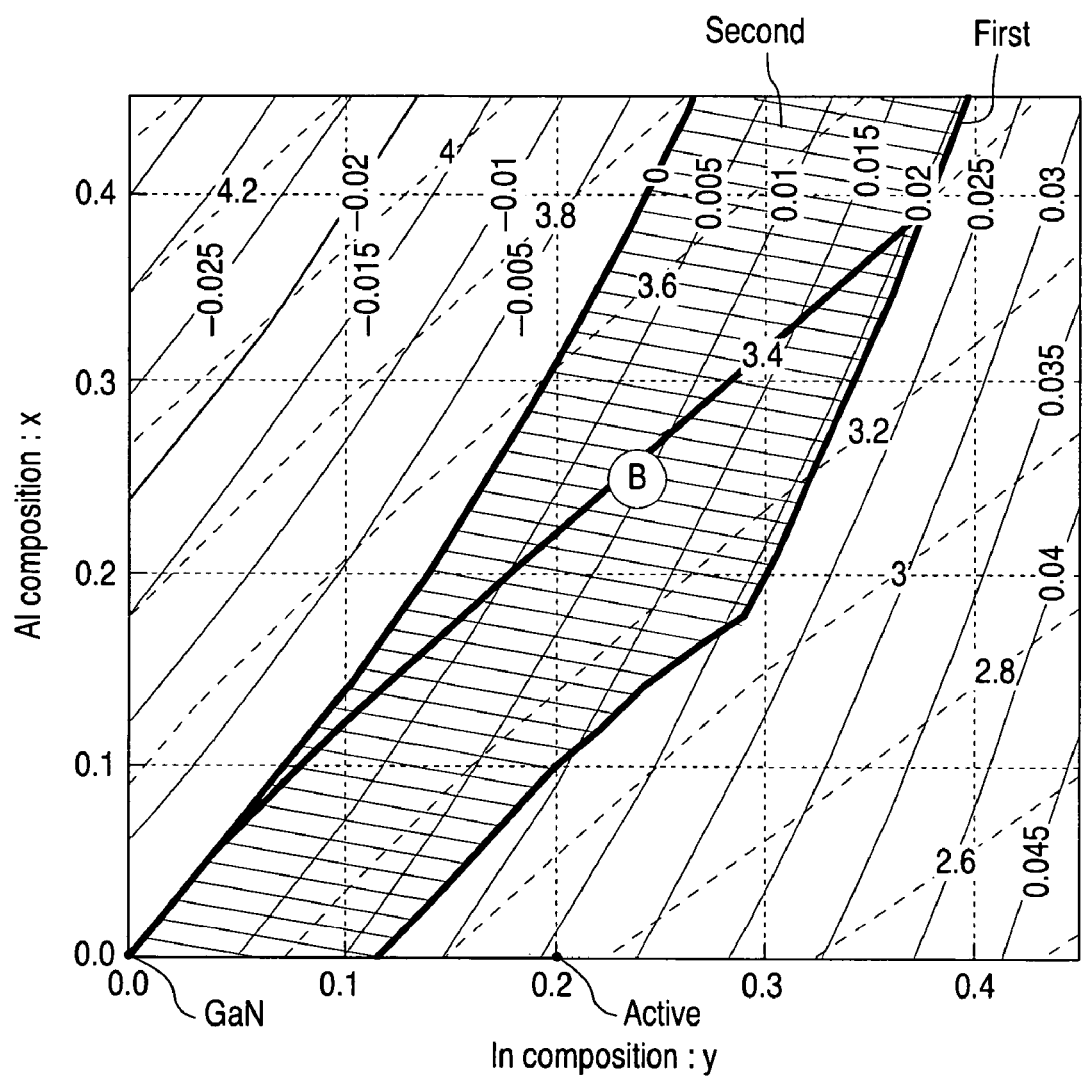

FIG. 5 illustrates an example of an InGaN active layer of 20% indium, $In_{0.2}Ga_{0.8}N$, which may emit green light when forward biased. The $In_{0.2}Ga_{0.8}N$ active region (labeled "Active") has a net polarization of about 0.021 $C/m^2$ and a band gap of about 2.9 eV. In the example given in FIG. 5, the minimum barrier height is again arbitrarily selected to be 0.2 eV.

A composition range for spacer layers according to the first embodiment, where the spacer layers have the same net polarization as the active region, is determined by following the 0.021 $C/m^2$ contour line to the composition where the difference in band gap is at least 0.2 eV, a composition of about $Al_{0.17}In_{0.28}Ga_{0.55}N$, which has a band gap of 3.1 eV. Any composition at this point or above along the 0.021 $C/m^2$ contour line (the line labeled "First" in FIG. 5) will provide a sufficiently high barrier spacer layer with the same net polarization as the active region.

A composition range for spacer layers according to the second embodiment, where the spacer layers have a minimum barrier height and a net polarization less than that of a conventional GaN spacer layer, is illustrated as shaded region "B" in FIG. 5. This region is bordered on the bottom right hand side by a curved line between about $In_{0.12}Ga_{0.88}N$ and about $Al_{0.17}In_{0.28}Ga_{0.55}N$, following a contour line representing the minimum barrier height of 0.2 eV. Region B is bordered on the top right hand side by a curved line between about $Al_{0.17}In_{0.28}Ga_{0.55}N$ and about $Al_{0.45}In_{0.40}Ga_{0.15}N$, representing the first embodiment composition range. Region B is bordered on the left hand side by a curved line between about GaN and about $Al_{0.45}In_{0.26}Ga_{0.29}N$, following a contour line representing the net polarization of a GaN spacer layer (labeled "GaN"). Any spacer layer composition within this shaded region will have a least a 0.2 eV barrier and a net polarization less than a GaN spacer layer. The solid line within region B represents spacer layer compositions with the same barrier height as a GaN spacer layer, but a net polarization less than that of a GaN spacer layer.

Though FIGS. 4 and 5 end at aluminum nitride and indium nitride compositions of 45%, layers with greater aluminum nitride and indium nitride compositions may be appropriate. The data illustrated in FIGS. 4 and 5 is not meant to limit the invention. The data in FIGS. 4 and 5 were calculated using techniques well known in the art and using the following material parameters. The data illustrated in FIGS. 4 and 5 may change if different values are used for the following material parameters:

|  |  | AlN | GaN | InN |
| --- | --- | --- | --- | --- |
| a-lattice | $a_0$ (Å) | 3.112 | 3.189 | 3.55 |
| c-lattice | $c_0$ (Å) | 4.982 | 5.185 | 5.76 |
| Band gap | $E_g$ (eV) | 6.2 | 3.4 | 0.85 |
| Elastic constants | c13 (GPa) | 94 | 68 | 70 |
|  | c33 (GPa) | 377 | 354 | 205 |
| Spontaneous polarization | $P_{sp}$ (C/m$^2$) | −0.09 | −0.034 | −0.042 |
| Piezoelectric constants | e31 (C/m$^2$) | −0.53 | −0.34 | −0.41 |
|  | e33 (C/m$^2$) | 1.5 | 0.67 | 0.81 |

|  |  | AlGaN | InGaN | AlInN |
| --- | --- | --- | --- | --- |
| Bowing parameter | B (eV) | 0.53 | 0.97 | 2.5 |

The data in FIGS. 4 and 5 were calculated as follows. Given the a-lattice constants $a_k$ and elastic constants $c_{ij,k}$ of AlN, GaN, and InN, the a-lattice constant $a_{AlInGaN}$ and strain $\epsilon_{zz}$ in a quaternary layer grown on GaN may be calculated according to the following equations:

$$a_{AlInGaN} = x \cdot a_{AlN} + y \cdot a_{InN} + z \cdot a_{GaN}$$

$$\varepsilon_{xx} = \varepsilon_{yy} = \frac{a_{GaN} - a_{AlInGaN}}{A_{AlInGaN}}$$

-continued $$\varepsilon_{zz} = \frac{-2 * C_{13}}{C_{33}} \cdot \varepsilon_{xx}$$

$$c_{ij} = x \cdot c_{ijAlN} + y \cdot c_{ijInN} + z \cdot c_{ijGaN}$$

Given the band gap $E_i$ of AlN, GaN, and InN and bowing parameters of $b_{ij}$ of each ternary alloy, the band gap of a free standing quaternary layer may be calculated according to the following equations:

$$E_{AlInGaN} = \frac{xy \cdot T_{12}(u) + yz \cdot T_{23}(v) + zx \cdot T_{31}(w)}{xy + yz + zx}$$

$$T_{ij}(x) = x \cdot E_j + (1-x) \cdot E_i + b_{ij} \cdot x(1-x)$$

$$u=(1-x+y)/2$$

$$v=(1-y+z)/2$$

$$w=(1-x+z)/2$$

The band gap of a strained quaternary layer grown on GaN (as illustrated by dashed contour lines in FIGS. 4 and 5) is related to the strain of the layer $\varepsilon_{zz}$ (calculated above) and the band gap of the free standing material, according to the equations:

$$E_\varepsilon = 15.4 \cdot \varepsilon_{zz}$$

$$E_g = E_{AlInGaN} + E_\varepsilon$$

Given the spontaneous polarization $P_{sp,k}$ and piezoelectric constants $e_{ij,k}$ for AlN, GaN, and InN, the spontaneous polarization $P_{sp}$ and piezoelectric polarization $P_{pz}$ in a quaternary layer grown on GaN may be calculated according to the following equations:

$$P_{sp} = x \cdot P_{spAlN} + y \cdot P_{spInN} + z \cdot P_{spGaN}$$

$$P_{pz} = 2 \cdot e_{31} \cdot \varepsilon_{xx} + e_{33} \cdot \varepsilon_{zz}$$

$$e_{ij} = x \cdot e_{ijAlN} + y \cdot e_{ijInN} + z \cdot e_{ijGaN}$$

The net polarization in the quaternary layer grown on GaN is then given by:

$$P = (P_{sp} - P_{spGaN}) + P_{pz}$$

As illustrated in FIG. 3, matching the net polarization of the spacer layers and the active region cancels the sheet charges at the interfaces between the spacer layers and the active region. These sheet charges are shifted to the interface between the p- and n-type regions and the spacer layers, where differences in composition between the layers that form the interface result in different net polarization on either side of the interface. Shifting the sheet charges away from the active region does not totally eliminate their effect on the active regions. The "tilt" of the energy bands in the active region illustrated in FIG. 3 is caused by the sheet charges at the interfaces between the spacer layers and the p- and n-type regions.

To eliminate sheet charges, U.S. Pat. No. 6,515,313 teaches "incorporating various dopants into the semiconductor. The dopant impurity should be of a type that does not diffuse away from its intended position. The dopants ionize, based upon their energy levels, into either positive or negative charge states, which are opposite to the interfacial polarization-induced charge states, to cancel or reduce its effect." U.S. Pat. No. 6,515,313 incorporates the dopants at the interfaces between the spacer layers and the active region. The incorporation of dopants, especially Mg, so close to the active region can degrade the crystal quality of the active region.

In some embodiments of the invention, the sheet charges are eliminated by making the spacer layers sufficiently thick to "screen" the active region from the sheet charges at the interfaces between the p- and n-type regions and the spacer layers, then doping the interfaces with the sheet charge with a dopant that neutralizes the sheet charge. In embodiments without thick spacer layers, the spacer layers often have a thickness between about 50 angstroms and about 200 angstroms. In embodiments with thick spacer layers, the spacer layers may have a thickness between about 500 angstroms and the critical thickness of the spacer layer, defined as the maximum thickness of the spacer layer that can be grown without cracking or relaxing. The thick spacer layers usually have a thickness between about 200 angstroms and about 1000 angstroms. In general, the thickness of the thick spacer layers is chosen to be thick enough to shield the active region from the doping to cancel the sheet charges, and thin enough to permit growth of a high crystal quality spacer layer.

A negative sheet charge accumulates at the interface between n-type or undoped spacer layer 22 and n-type region 21. This sheet charge may be canceled by incorporating a region of highly n-type doped material as close to the interface as possible. The highly doped region may be in the part of n-type region 21 or spacer layer 22 adjacent to the interface. For example, a region 10 angstroms thick and having a Si concentration between about $1 \times 10^{18}$ cm$^{-3}$ and $1 \times 10^{20}$ cm$^{-3}$ may be incorporated in n-type region 21 or spacer layer 22, immediately adjacent to the interface between these two layers. More preferably, the highly doped region has a Si concentration between about $5 \times 10^{19}$ cm$^{-3}$ and $1 \times 10^{20}$ cm$^{-3}$. Similarly, a positive sheet charge accumulates at the interface between p-type spacer layer 24 and p-type region 25. This sheet charge may be canceled by incorporating a region of highly p-type doped material in the part of p-type region 25 or spacer layer 24 adjacent to the interface. For example, a region 10 angstroms thick and having a Mg concentration between about $1 \times 10^{18}$ cm$^{-3}$ and $1 \times 10^{20}$ cm$^{-3}$ may be incorporated in p-type region 25 or spacer layer 24, immediately adjacent to the interface between these two layers. More preferably, the highly doped region has a Mg concentration between about $5 \times 10^{19}$ cm$^{-3}$ and $1 \times 10^{20}$ cm$^{-3}$.

The amount of doping required at the interfaces between the spacer layers and the p- and n-type regions may depend on the magnitude of the sheet charge, which depends on the compositions of the layers in the device. Generally, the thickness and dopant concentration are selected such that the dopant concentration in the highly doped area times the thickness of the highly doped area is about equal to the sheet charge at the interface. Accordingly, the higher the dopant concentration in the highly doped area, the thinner this area needs to be to cancel the sheet charge. In some embodiments, the sheet charges may be canceled by incorporating lower concentrations of dopants in the n- and p-type regions or in the spacer layers over greater thicknesses. In addition, as the composition of indium in the active region increases, the magnitude of the sheet change increases. In the examples given above, the sheet charges in the device with 20% indium quantum wells may be twice the magnitude of the sheet charges in the device with 10% indium quantum wells.

Figure 6:
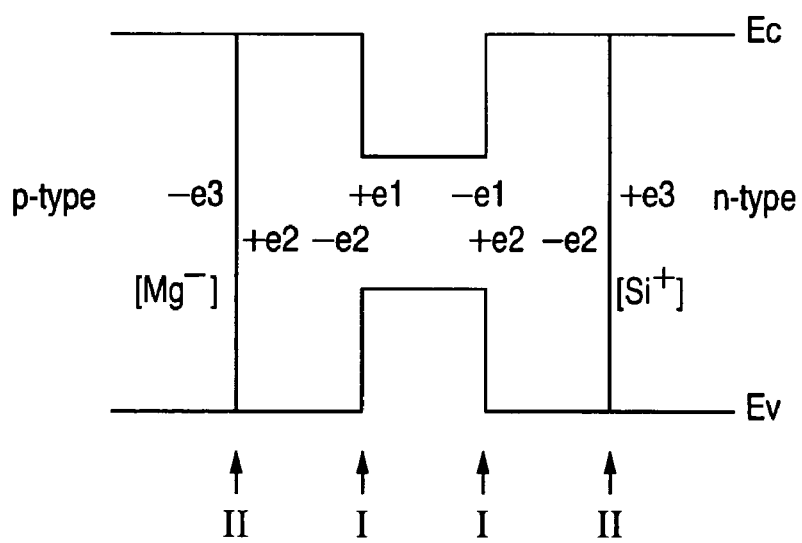
FIG. 6 is an energy band diagram of a device where the spacer layers and active region have the same net polarization and where the sheet charges are eliminated with thick spacer layers and doping at the sheet charge interface.

FIG. 6 is an energy band diagram with a device where the spacer layers and active region have the same net polarization and where the sheet charges are eliminated with thick spacer layers and doping at the sheet charge interface. As illustrated in FIG. 6, both the bending of the energy bands at the interfaces between the layers and the tilt of the energy bands in the active region is eliminated.

Figure 7:
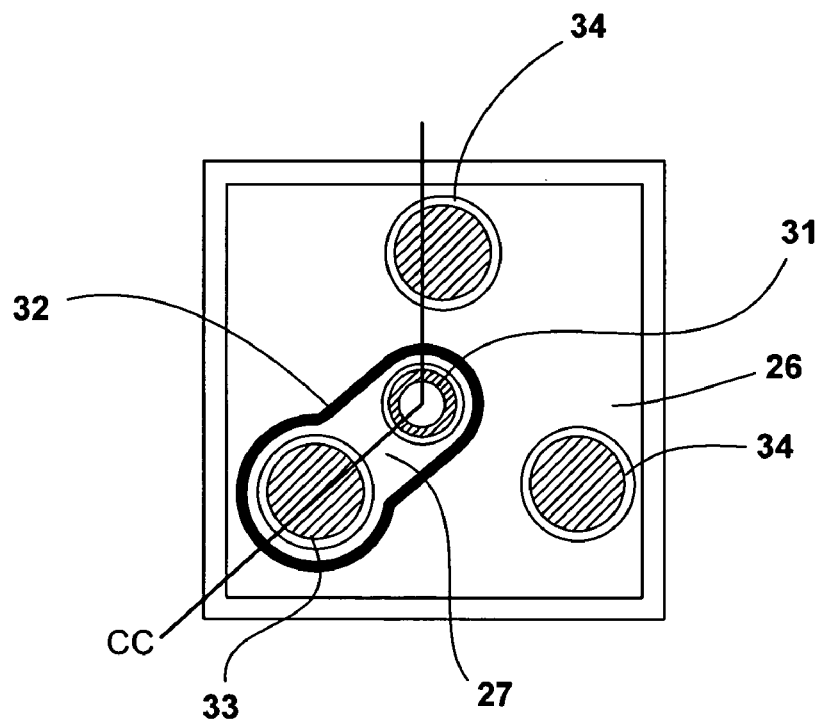
FIGS. 7 and 8 are a plan view and a cross sectional view of a small junction light emitting device.
Figure 8:
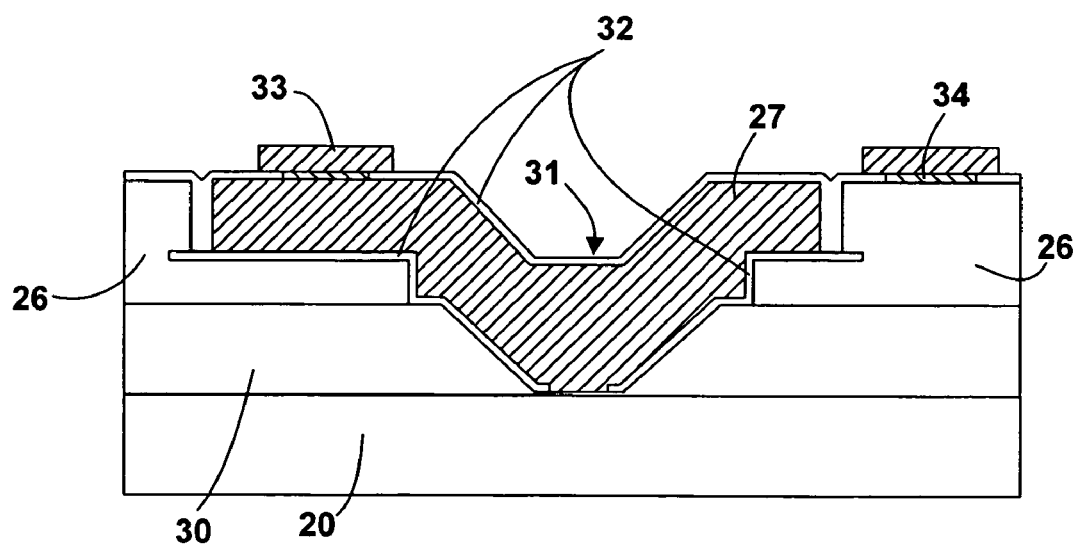

FIG. 7 is a plan view of a small junction device (i.e. an area less than one square millimeter). FIG. 8 is a cross section of the device shown in FIG. 7, taken along axis CC. FIGS. 7 and 8 illustrate an arrangement of contacts that may be used with any of the epitaxial structures 30 illustrated in FIG. 2 and described above. The device shown in FIGS. 7 and 8 has a single via 21 etched down to an n-type layer of epitaxial structure 30 below the active region. An n-contact 27 is deposited in via 21. N-via 21 is located at the center of the device to provide uniformity of current and light emission. A p-contact 26 provides electrical contact to the p-side of the active region of epitaxial structure 30. N-contact 27 is separated from the p-contact 26 by one or more dielectric layers 32. A p-submount connection 34, for example, a wettable metal for connecting to solder, connects to p-contact 26 and an n-submount connection 33 connects to n-contact 27.

As illustrated in FIG. 7, the device is connected to a submount by three submount connections, two p-submount connections 34 and one n-submount connection 33. N-submount connection 33 may be located anywhere within n-contact region 27 (surrounded by insulating layer 32) and need not be located directly over via 31. Similarly, p-submount connections 34 may be located anywhere on p-contact 26. As a result, the connection of the device to a submount is not limited by the shape or placement of p-contact 26 and n-contact 27.

FIG. 9 is a plan view of a large junction device (i.e. an area greater than or equal to one square millimeter). FIG. 10 is a cross section of the device shown in FIG. 9, taken along axis DD. FIGS. 9 and 10 also illustrate an arrangement of contacts that may be used with any of the epitaxial structures 30 illustrated in FIG. 2 and described above. The active region of epitaxial structure 30 is separated into four regions separated by three trenches in which n-contacts 27 are formed. Each region is connected to a submount by four p-submount connections 34 formed on p-contact 26. N-contact 27 surrounds the four active regions. N-contact 27 is connected to a submount by six n-submount connections 33. The n- and p-contacts may be electrically isolated by an insulating layer 32.

Figure 11:
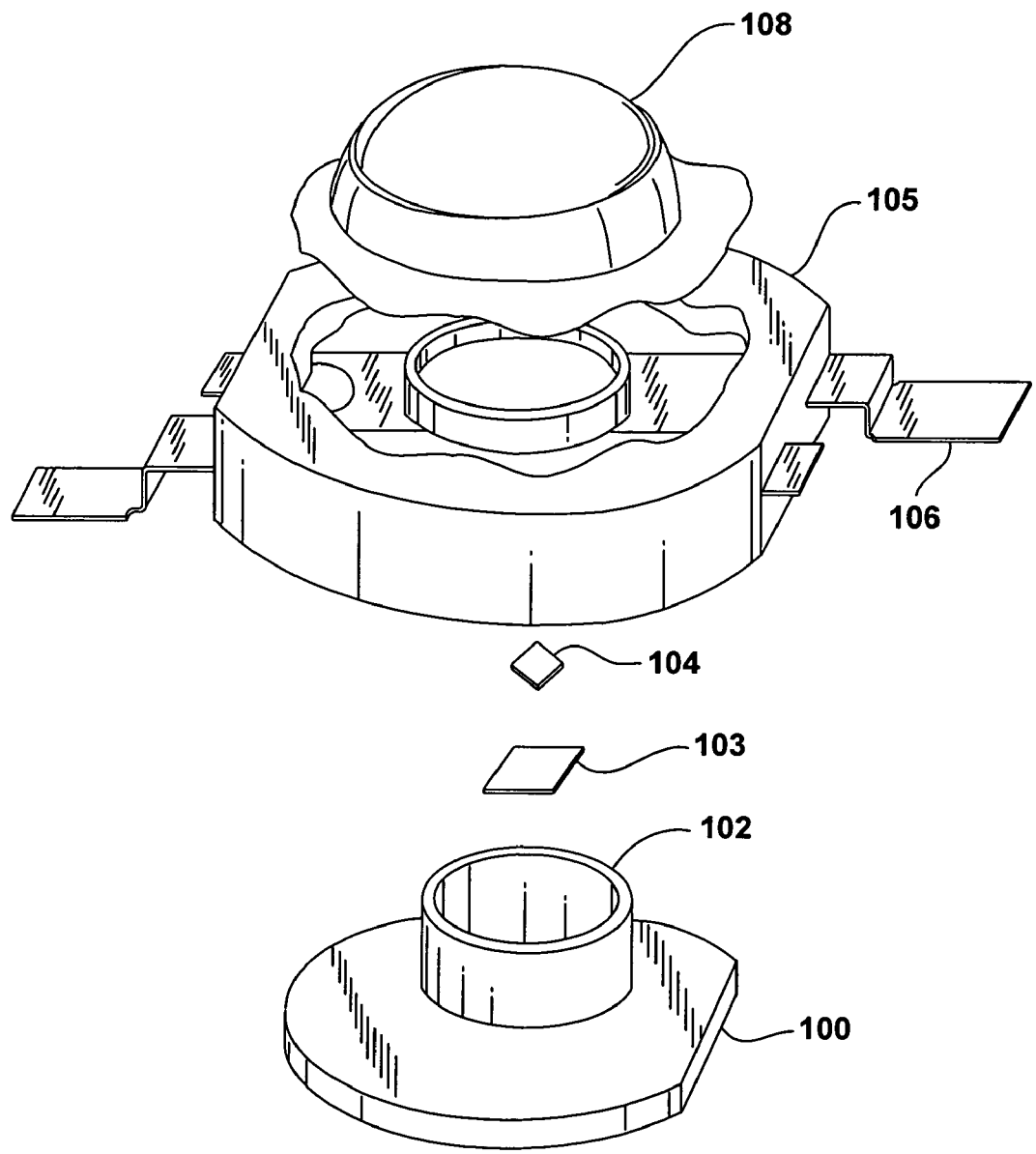
FIG. 11 is an exploded view of a packaged light emitting device.

FIG. 11 is an exploded view of a packaged light emitting device. A heat-sinking slug 100 is placed into an insert-molded leadframe. The insert-molded leadframe is, for example, a filled plastic material 105 molded around a metal frame 106 that provides an electrical path. Slug 100 may include an optional reflector cup 102. The light emitting device die 104, which may be any of the devices described above, is mounted directly or indirectly via a thermally conducting submount 103 to slug 100. An optical lens 108 may be added.

Reducing the effect of polarization fields on the active region according to embodiments of the invention may have several advantages. First, carrier recombination rate may increase, increasing the quantum efficiency of the device. Second, the carrier recombination lifetime may be reduced, reducing the carrier density at a given current density, and resulting in improved quantum efficiency at increased drive currents. Third, electron and hole injection efficiency may increase, leading to more uniform filling of the active region with carriers. Each of these effects may improve the efficiency of the device.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A semiconductor light emitting device comprising:
   first and second spacer layers; and
   a light emitting layer sandwiched between the first and second spacer layers;
   wherein a difference between a net polarization in at least one of the spacer layers and a net polarization in the light emitting layer is less than a difference between a net polarization in GaN and the net polarization in the light emitting layer, and a difference between the net polarization in at least one of the spacer layers and the net polarization in the light emitting layer is less than 0.02 C/m$^2$.

2. The device of claim 1 wherein at least one of the spacer layers comprises $Al_xIn_yGa_zN$, where $0<x\leq1$, $0<y\leq1$, and $0<z\leq1$.

3. The device of claim 1 wherein the light emitting layer comprises at least one layer of InGaN.

4. The device of claim 1 wherein the difference between the net polarization in at least one of the spacer layers and the net polarization in the light emitting layer is less than 0.01 C/m$^2$.

5. The device of claim 1 wherein the difference between the net polarization in at least one of the spacer layers and the net polarization in the light emitting layer is less than 0.005 C/m$^2$.

6. The device of claim 1 wherein the difference between the net polarization in at least one of the spacer layers and the net polarization in the light emitting layer is about 0 C/m$^2$.

7. The device of claim 1 wherein a difference between a band gap in at least one of the spacer layers and a band gap in the light emitting layer is greater than 0.1 eV.

8. The device of claim 1 wherein a difference between a band gap in at least one of the spacer layers and a band gap in the light emitting layer is greater than 0.2 eV.

9. The device of claim 1 wherein the light emitting layer comprises at least one InGaN layer with a composition between $In_{0.05}Ga_{0.95}N$ and $In_{0.5}Ga_{0.85}N$.

10. The device of claim 9 wherein at least one of the spacer layers is a quaternary alloy of aluminum, indium, gallium, and nitrogen.

11. The device of claim 9 wherein at least one of the spacer layers is a quaternary alloy of aluminum, indium, gallium, and nitrogen; and
    an aluminum composition in the quaternary alloy spacer layer is greater than zero and less than or equal to 20%; and
    an indium composition in the quaternary alloy spacer layer is greater than zero and less than or equal to 22%.

12. The device of claim 9 wherein:
    at least one of the spacer layers is a quaternary alloy of aluminum, indium, gallium, and nitrogen; and
    an aluminum composition in the quaternary alloy spacer layer is greater than or equal to 20%.

13. The device of claim 12 wherein the indium composition in the quaternary alloy spacer layer is greater than or equal to 22%.

14. The device of claim 1 wherein the light emitting layer comprises at least one InGaN layer with a composition between $In_{0.15}Ga_{0.85}N$ and $In_{0.5}Ga_{0.5}N$.

15. The device of claim 14 wherein at least one of the spacer layers is a quaternary alloy of aluminum, indium, gallium, and nitrogen.

16. The device of claim 14 wherein at least one of the spacer layers is a quaternary alloy of aluminum, indium, gallium, and nitrogen; and
an aluminum composition in the quaternary alloy spacer layer is greater than zero and less than or equal to 17%; and
an indium composition in the quaternary alloy spacer layer is greater than zero and less than or equal to 28%.

17. The device of claim 14 wherein:
at least one of the spacer layers is a quaternary alloy of aluminum, indium, gallium, and nitrogen; and
an aluminum composition in the quaternary alloy spacer layer is greater than or equal to 17%.

18. The device of claim 17 wherein the indium composition in the quaternary alloy spacer layer is greater than or equal to 28%.

19. The device of claim 1 wherein at least one of the spacer layers has a thickness between about 200 angstroms and about 1000 angstroms.

20. The device of claim 1 wherein at least one of the spacer layers has a thickness between about 200 angstroms and a critical thickness of the spacer layer.

21. The device of claim 1 further comprising:
an n-type region adjacent to a surface of the first spacer layer opposite the light emitting layer; and
a p-type region adjacent to a surface of the second spacer layer opposite the light emitting layer.

22. The device of claim 21 further comprising a highly doped region of n-type material adjacent to an interface between the first spacer layer and the n-type region, the highly doped region of n-type material having a dopant concentration between about $1\times10^{18}$ cm$^{-3}$ and about $1\times10^{20}$ cm$^{-3}$ and a thickness between about 10 angstroms and about 100 angstroms.

23. The device of claim 22 wherein the highly doped region of n-type material has a dopant concentration between about $5\times10^{19}$ cm$^{-3}$ and about $1\times10^{20}$ cm$^{-3}$.

24. The device of claim 22 wherein the highly doped region of n-type material is located within the first spacer layer.

25. The device of claim 22 wherein the highly doped region of n-type material is located within the n-type region.

26. The device of claim 21 further comprising a highly doped region of p-type material adjacent to an interface between the second spacer layer and the p-type region, the highly doped region of p-type material having a dopant concentration between about $1\times10^{18}$ cm$^{-3}$ and about $1\times10^{20}$ cm$^{-3}$ and a thickness between about 10 angstroms and about 100 angstroms.

27. The device of claim 26 wherein the highly doped region of p-type material has a dopant concentration between about $5\times10^{19}$ cm$^{-3}$ and about $1\times10^{20}$ cm$^{-3}$.

28. The device of claim 26 wherein the highly doped region of p-type material is located within the second spacer layer.

29. The device of claim 26 wherein the highly doped region of p-type material is located within the p-type region.

30. The device of claim 1 wherein the light emitting layer is a first quantum well, the device further comprising a second quantum well, and a barrier layer disposed between the first quantum well and the second quantum well.

31. The device of claim 30 wherein the barrier layer comprises $Al_xIn_yGa_zN$, where $0<x\leq1$, $0<y\leq1$, and $0<z\leq1$.

32. The device of claim 30 wherein a net polarization in the barrier layer is less than a net polarization in GaN, and a difference between the net polarization in the barrier layer and a net polarization in at least one of the quantum wells is less than 0.02 C/m$^2$.

33. The device of claim 30 wherein the difference between the net polarization in the barrier layer and the net polarization in at least one of the quantum wells is less than 0.01 C/m$^2$.

34. The device of claim 30 wherein the difference between the net polarization in the barrier layer and the net polarization in at least one of the quantum wells is less than 0.005 C/m$^2$.

35. The device of claim 30 wherein the difference between the net polarization in the barrier layer and the net polarization in at least one of the quantum wells is about 0 C/m$^2$.

36. The device of claim 1 wherein the light emitting layer comprises $Al_xIn_yGa_zN$, where $0<x\leq1$, $0<y\leq1$, and $0<z\leq1$.

37. A semiconductor light emitting device comprising:
first and second spacer layers; and
an active region sandwiched between the first and second spacer layers, the active region comprising a first quantum well, a second quantum well, and a barrier layer disposed between the first quantum well and the second quantum well;
wherein a difference between a net polarization in the barrier layer and a net polarization in at least one of the quantum wells is less than a difference between a net polarization in GaN and the net polarization in at least one of the quantum wells, and a difference between the net polarization in the barrier layer and the net polarization in at least one of the quantum wells is less than 0.02 C/m$^2$.

38. The device of claim 37 wherein the barrier layer comprises $Al_xIn_yGa_zN$, where $0<x\leq1$, $0<y\leq1$, and $0<z\leq1$.

39. The device of claim 37 wherein the difference between the net polarization in the barrier layer and the net polarization in at least one of the quantum wells is less than 0.01 C/m$^2$.

40. The device of claim 37 wherein the difference between the net polarization in the barrier layer and the net polarization in at least one of the quantum wells is less than 0.005 C/m$^2$.

41. The device of claim 37 wherein the difference between the net polarization in the barrier layer and the net polarization in at least one of the quantum wells is about 0 C/m$^2$.

* * * * *